United States Patent
Mori

[11] Patent Number: 5,838,036
[45] Date of Patent: Nov. 17, 1998

[54] SEMICONDUCTOR MEMORY DEVICE CAPABLE OF REALIZING A MINIMUM MEMORY CELL AREA APPROXIMATE TO A THEORETICAL VALUE

[75] Inventor: Hidemitsu Mori, Tokyo, Japan

[73] Assignee: NEC Corporation, Japan

[21] Appl. No.: 746,440

[22] Filed: Nov. 8, 1996

[30] Foreign Application Priority Data

Nov. 10, 1995 [JP] Japan .................................. 7-293198

[51] Int. Cl.⁶ .................................................. H01L 27/108
[52] U.S. Cl. ........................................... 257/296; 257/306
[58] Field of Search .................................. 257/296, 301, 257/306, 532

[56] References Cited

U.S. PATENT DOCUMENTS

| | | | |
|---|---|---|---|
| 5,014,103 | 5/1991 | Ema | 357/41 |
| 5,363,326 | 11/1994 | Nakajima | 365/149 |
| 5,391,901 | 2/1995 | Tanabe | 257/296 |
| 5,583,358 | 12/1996 | Kimura et al. | 257/306 |
| 5,604,365 | 2/1997 | Kajigaya et al. | 257/296 |

FOREIGN PATENT DOCUMENTS 4279055  10/1992  Japan .

OTHER PUBLICATIONS

Eimori et al; "A Newly Designed Planar Stacked Capacitor Cell with High dielectric Constant Film for 256Mbit DRAM"; 1993; pp. 631–634; IEDM Tech. Dig.

Shibahara et al; "1GDRAM Cell with Diagonal Bit–Line (DBL) Configuration and Edge Operation MOS (EOS) FET"; 1994; pp. 639–642; IEDM Tech. Dig.

Primary Examiner—Sara W. Crane
Attorney, Agent, or Firm—Hayes, Soloway, Hennessey, Grossman, Hage, P.C.

[57] ABSTRACT

In semiconductor memory device, word lines (2a) are arranged in parallel to each other on a semiconductor substrate (9). Each of the device active regions (1) has first oblique intersection portions (1a) which obliquely intersect adjacent two of the word lines (2a) in first oblique directions with a distance left between each of the device active regions (1) and the adjacent two of the word lines (2a). Each of bit lines (4) has second oblique intersection portions (4a) which obliquely intersect the adjacent two of the word lines (4) in second oblique directions reverse with respect to the first oblique directions with another distance left between each of the bit lines (4) and the adjacent two of the word lines (2a). The first oblique directions of the first oblique intersection portions (1a) of each of the device active regions (1) are reversed at every memory cell (or at every two memory cells). The second oblique directions of the second oblique intersection portions (4a) of each of the bit lines (4) are reversed at every memory cell (or at every two memory cells).

5 Claims, 11 Drawing Sheets

5,838,036

SEMICONDUCTOR MEMORY DEVICE CAPABLE OF REALIZING A MINIMUM MEMORY CELL AREA APPROXIMATE TO A THEORETICAL VALUE

BACKGROUND OF THE INVENTION

Field of the Invention

This invention relates to a semiconductor memory device and, in particular, to an arrangement of memory cells in a dynamic random access memory (DRAM).

With development of DRAM memory cells of finer structure, a sufficient capacitor storage capacity becomes difficult to obtain. In this connection, use has widely been made of a COB (Capacitor Over Bit-line) structure in which the capacitor is formed at an uppermost portion of a cell structure. This is because total surface area of a capacitor storage electrode can be increased with the above-mentioned structure.

However, conventional DRAM's of the COB structure have various problems which will later be described.

SUMMARY OF THE INVENTION

It is therefore an object of this invention to provide a semiconductor memory device having memory cells of an open-bit-line COB structure, which is capable of realizing a minimum memory cell area approximate to a theoretical value.

Other objects of this invention will become clear as the description proceeds.

According to this invention, there is provided a semiconductor memory device comprising: a semiconductor substrate; device active regions separately formed on the semiconductor substrate; a memory cell array comprising a matrix of memory cell pairs, each pair of the memory cell pairs being formed on each of the device active regions and comprising a pair of memory cells, each of which comprises a charge-storage capacitor and a selection MOS transistor having a gate region and first and second regions, the first region being a predetermined one of a source region and a drain region, the second region being a remaining one of the source and the drain regions that is connected to the charge-storage capacitor; word lines connected to the gate regions of the selection MOS transistors of the memory cells and arranged in parallel to each other on the semiconductor substrate; and bit lines connected to the first regions of the selection MOS transistors of the memory cells. Each of the device active regions has first oblique intersection portions which obliquely intersect adjacent two of the word lines in first oblique directions with a distance left between each of the device active regions and the adjacent two of the word lines. Each of the bit lines has second oblique intersection portions which obliquely intersect the adjacent two of the word lines in second oblique directions reverse with respect to the first oblique directions with another distance left between each of the bit lines and the adjacent two of the word lines.

DESCRIPTION OF THE PREFERRED EMBODIMENTS

Figure 1A:
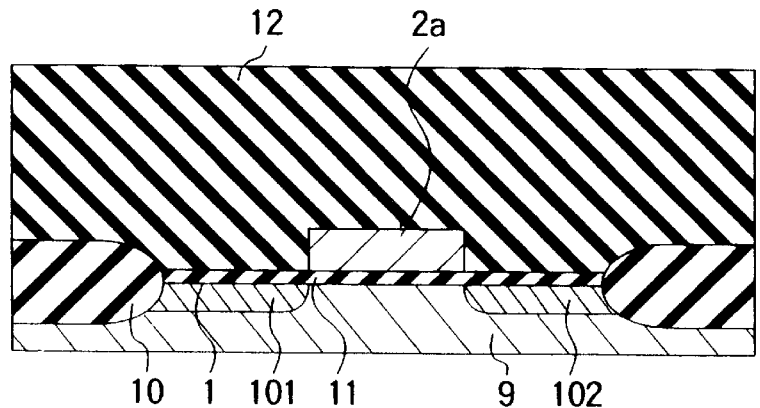
FIGS. 1A through 1H are sectional views for describing a process of manufacturing a DRAM of a typical COB structure.

Referring to FIGS. 1A through 1H, description will first be made as regards a process of manufacturing a DRAM having a COB structure for a better understanding of this invention, FIGS. 1A through 1H are sectional views for describing a process of manufacturing a DRAM having a COB structure. At first referring to FIG. 1A, a field oxide film 10 is formed on a P$^-$-type semiconductor substrate 9 by typical local oxidation of silicon (LOCOS) or the like. A gate oxide film 11 is formed on a device active region 1 bounded by the field oxide film 10. Thereafter, a conductor film such as a polysilicon film or a tungsten silicide film Is grown on an overall surface to a thickness on the order of 200 nm and then patterned into a predetermined shape to form a word line 2a which serves as a gate region. An impurity is doped into the substrate in the device active region 1 to form a source region 101 and a drain region 102. Then, a first interlayer insulator film 12 such as a silicon oxide film containing an impurity such as phosphorus or boron is grown on an overall surface to a thickness on the order of 300 nm.

Figure 1B:
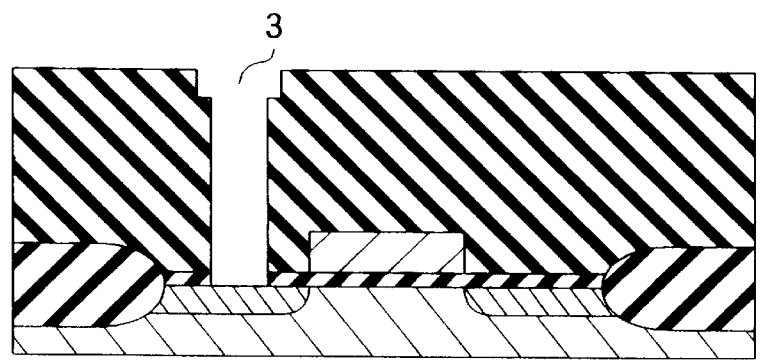

Next, as illustrated in FIG. 1B, an aperture 3 is formed by typical photolithography and etching. The aperture 3 serves to connect the source region of the device active region 1 and a bit line (later illustrated).

Figure 1C:
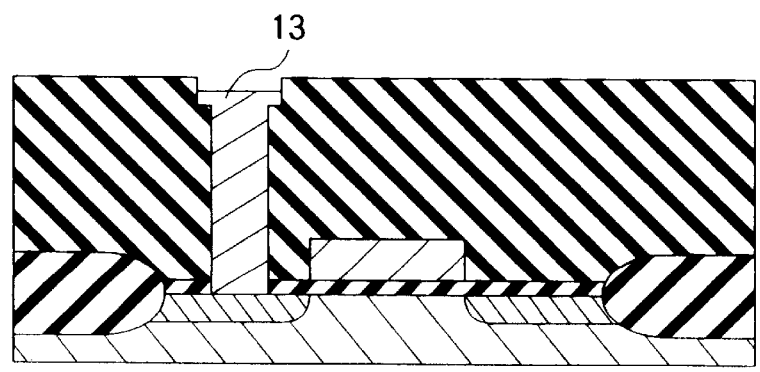

As illustrated in FIG. 1C, a polysilicon film containing an impurity such as phosphorus is grown on an overall surface to a thickness on the order of 600 nm and etched back to form a first buried conductor layer 13 in the aperture 3 as a contact layer.

Figure 1D:
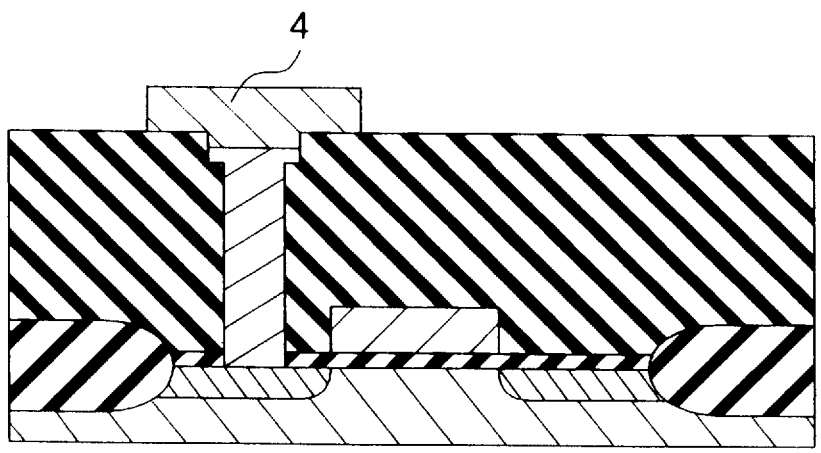

As illustrated in FIG. 1D, a conductor layer such as a tungsten silicide film is grown on an overall surface to a thickness on the order of 150 nm and patterned into a predetermined shape to form the bit line 4.

Figure 1E:
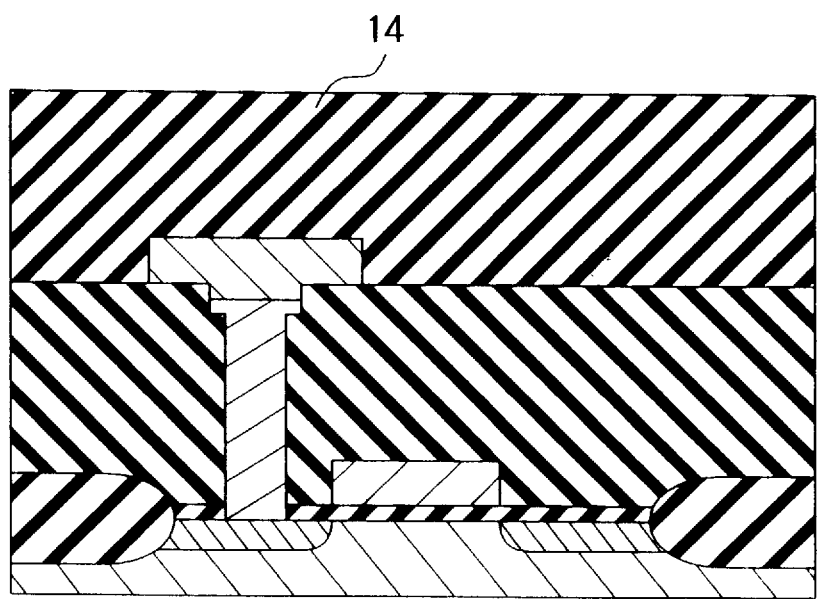

As illustrated in FIG. 1E, a second interlayer insulator film 14 such as a silicon oxide film containing an impurity such as phosphorus or boron is grown on an overall surface to a thickness on the order of 300 nm.

Figure 1F:
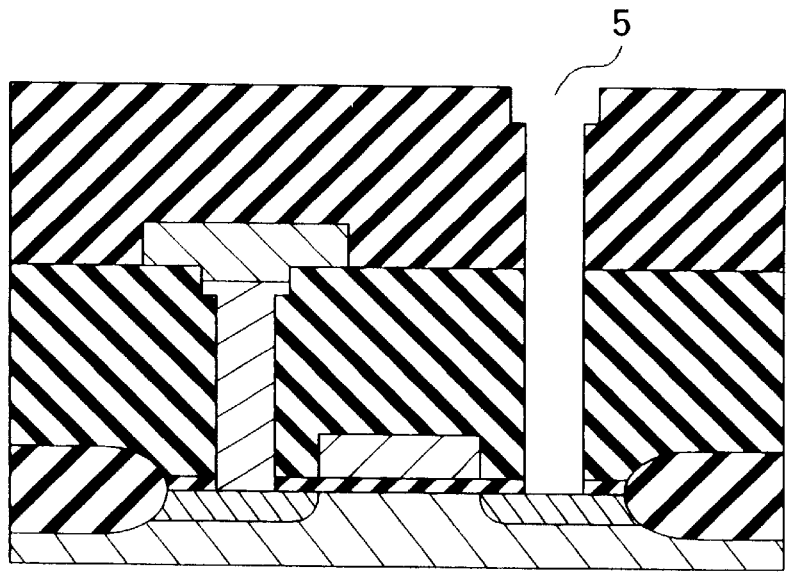

As illustrated in FIG. 1F, an aperture 5 is formed by the typical photolithography and etching. The aperture 5 serves to connect the device active region 1 and a storage node electrode 11' which will later be formed.

Figure 1G:
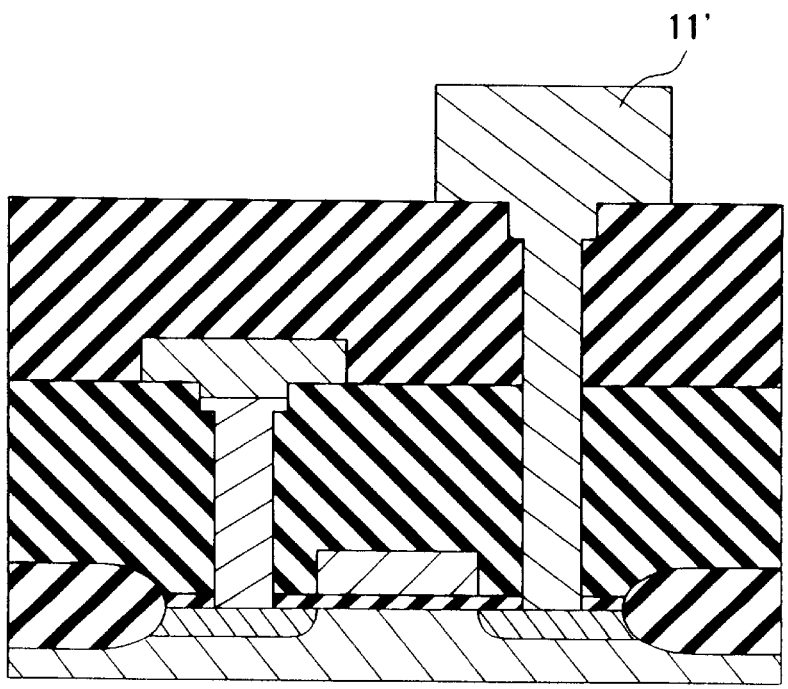

As illustrated in FIG. 1G, a polysilicon film containing an impurity such as phosphorus is grown on an overall surface to a thickness on the order of 600 nm and then patterned into a predetermined shape to form the storage node electrode 11'. If the storage node electrode 11' has a three-dimensional structure such as a fin shape or a cylindrical shape, the storage capacity of the capacitor can further be increased.

Figure 1H:
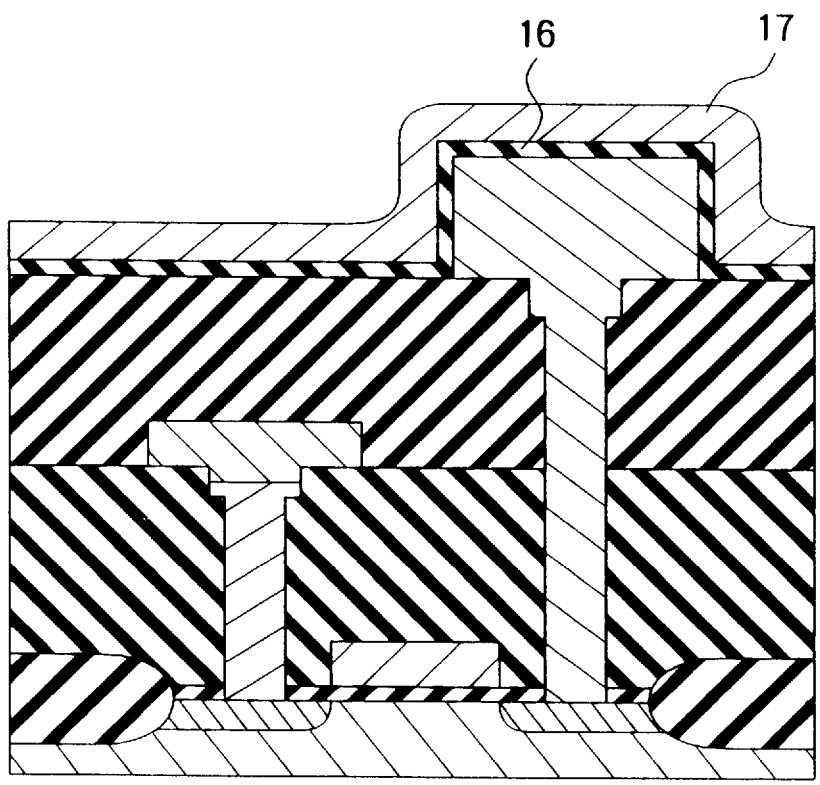

As illustrated in FIG. 1H, a capacitor insulator film 16 such as a silicon nitride film is grown on an overall surface to a thickness on the order of 6 nm. A polysilicon film containing an impurity such as phosphorus is grown on an overall surface to a thickness on the order of 150 nm and patterned into a predetermined shape to form a plate electrode 17. Thus, a DRAM memory cell is completed.

In FIGS. 1A through 1H, a single memory cell is formed on each device active region 1 bounded by the field oxide film 10 for brevity of description and illustration. This single memory cell comprises a charge-storage capacitor (16 and 17) and a selection MOS transistor (101, 102, 11, and 2a). In the following description, description will be made as regards a case where a pair of the memory cells are formed on each device active region 1 as a memory cell pair.

In the COB structure described above, the aperture 5 connecting the node electrode 11' and the device active region 1 is formed above the bit line 4 after the bit line 4 is formed. Accordingly, the aperture 5 must be formed in a manner that the aperture 5 can avoid the word line 2a and the bit line 4 already formed.

Figure 2:
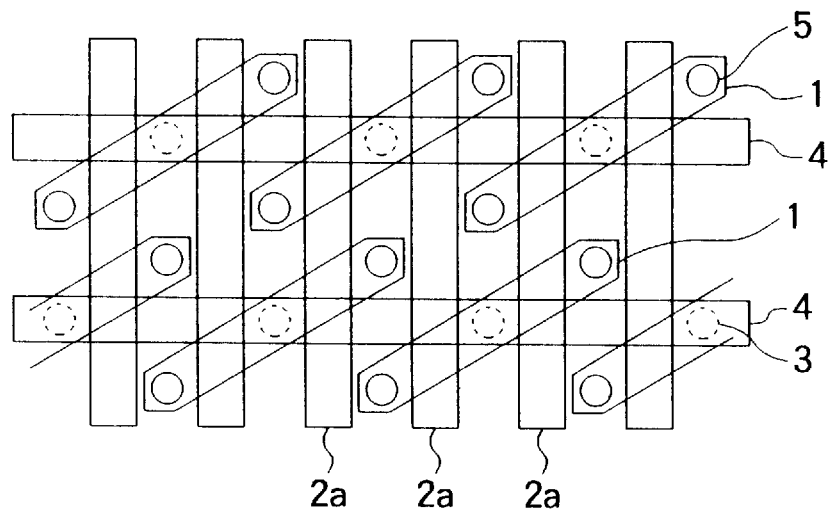
FIG. 2 is a plan view of a memory cell arrangement of a conventional semiconductor memory device.

In the meanwhile, arrangement of the DRAM memory cells is carried out in various manners mainly classified into a folded-bit-line type and an open-bit-line type. The difference therebetween resides in whether two bit lines connected to a sense amplifier is arranged on one side or opposite sides. It is assumed that each layer within the cell has a minimum size F in line width and in line interval. In this event, a theoretical minimum memory cell area is equal to $6F^2$ for the open-bit-line type. In case of an open-bit-line cell, however, a skillful technique is required in order to form the aperture 5 at a position avoiding each conductor line. Specifically, such technique includes oblique arrangement of any layer and formation of a diffusion layer in a convex shape. FIG. 2 shows one approach (see T. Eimori et al, IEDM Tech. Dig., p611, 1993) in which the device active regions 1 are obliquely arranged with respect to the word lines 2a and the bit lines 4. However, because the device active regions 1 are obliquely arranged, even a minimum memory cell area is considerably greater than the theoretical value in order to satisfy that the line width and the line interval are equal to F at minimum. Specifically, the area is on the order of about $7F^2$ with the word lines at about 2F pitch and the bit line side at about 3.5 pitch.

Figure 3:
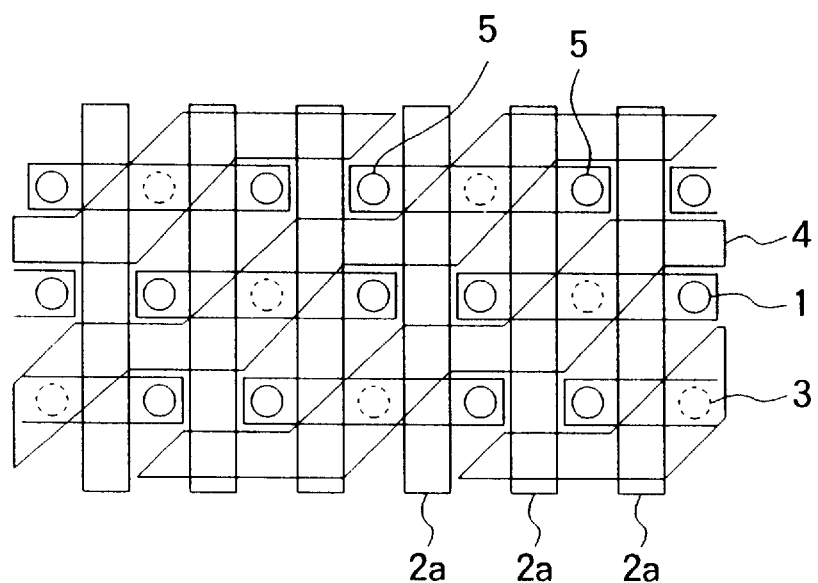
FIG. 3 is a plan view of a memory cell arrangement of another conventional semiconductor memory device.

On the other hand, as one approach to achieve a very small cell area, it is proposed to arrange the bit lines 4 in an oblique direction with respect to the word lines 2a, as illustrated in FIG. 3 (see K. Shibahara et al., IEDM Tech. Dig., 1994, p639) and FIG. 4 (see Japanese Unexamined Patent Publication No. 279055/1992). In case of FIG. 3, it is possible to arrange the memory cells so that the memory cell area is equal to $6F^2$. It is noted here that, in case of FIGS. 3 and 4, the memory cell region 18 has a parallelogramic shape as a whole as illustrated in FIG. 5 because the bit lines 4 are oblique. As a result, an area loss 19 is formed over and under the memory cell region 18. In order to minimize the area loss 19, proposal has been made of a folded structure illustrated in FIGS. 6A and 6B. The folded structure is realized by dividing a cell array into double mini-arrays symmetrical with respect to a direction of the word lines and connecting them through a connecting portion. In case of an oblique-bit-line cell, the minimum cell size is on the order of about $6.3F^2$ including the above-mentioned area loss 19.

Figure 4:
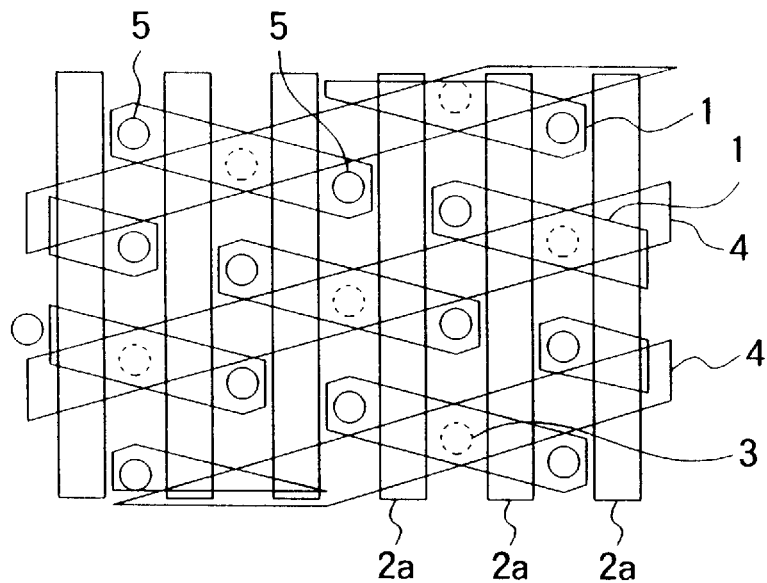
FIG. 4 is a plan view of a memory cell arrangement of still another conventional semiconductor memory device.
Figure 5:
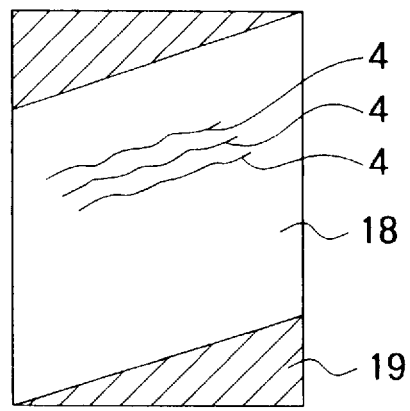
FIG. 5. shows a whole memory cell region in the conventional semiconductor memory device illustrated in FIGS. 3 or 4.
Figure 6A:
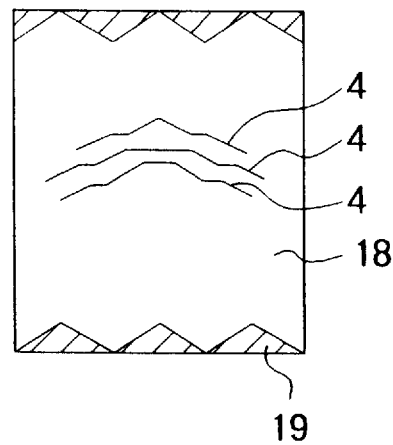
FIGS. 6A and 6B show the whole memory cell region of the conventional semiconductor memory device illustrated in FIGS. 3 or 4.
Figure 6B:
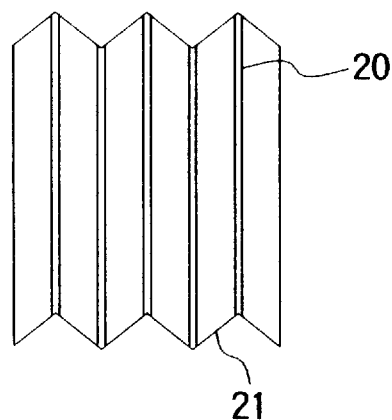
Figure 7:
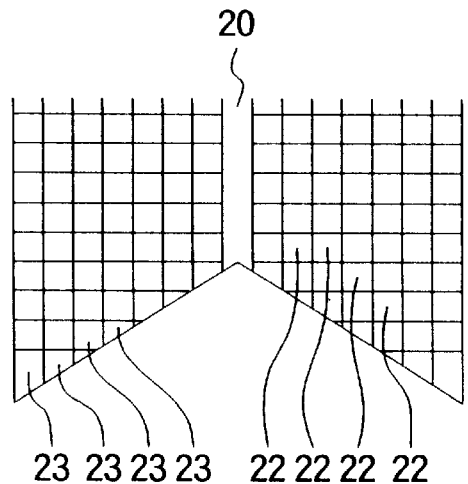
FIG. 7 is an enlarged view of a corner portion in the whole memory cell region illustrated in FIGS. 6A and 6B.

A first problem of the conventional technique is frequent occurrence of pattern defect upon the photolithography in case of the oblique-bit-line cells as shown in FIGS. 3 and 4. Specifically, as illustrated in FIGS. 6A and 6B, the memory cell region 18 includes bit line folding portions 20 where the memory cells are discontinuous, and corner portions 21 around which a greater part is vacant without any cell arranged therein. In case of the photolithography using light beam exposure, those portions with a discontinuity of the memory cells or with a few cells therearound are susceptible to a pattern defect that a pattern is thickened or thinned as compared with the remaining portions. In a DRAM of 1 G, 4 G, or a greater scale, it is expected that the light beam exposure encounters the limit and electron beam exposure is used instead. In the current status, the electron beam exposure is carried out by a combination of a simultaneous block exposure portion 22 and a variable shape exposure portion 23. The simultaneous block exposure is a technique of carrying out exposure by irradiation of an electron beam over a particular mask in the manner similar to normal light beam exposure. Currently, such mask has a size including no more than several cell regions. On the other hand, the variable shape exposure is a technique of direct writing by the electron beam in accordance with predetermined data. In case of the oblique-open-bit-line cell, the memory cell region inevitably has the corner portions 21. The corner portions 21 must be exposed by the use of the variable shape exposure. In this event, misalignment or dimensional error is often caused to occur at a boundary between the simultaneous block exposure portion 22 and the variable shape exposure portion 23.

A second problem of the conventional technique is an increase in cell area in case of the cell having the oblique diffusion layer as shown in FIG. 2. Specifically, the pattern defect described above is difficult to occur in the memory cell region having a rectangular shape because the memory cells are continuously formed to the end of the cell regions However, in order to make a whole of the memory cell region have a normal rectangular shape, the memory cell in the conventional technique has a shape illustrated in FIG. 2. Thus, although the memory cell region has a rectangular shape as a whole, even the minimum memory cell area is equal to $7F^2$ which is much greater than the theoretical value.

This invention provides a semiconductor memory device having memory cells of an open-bit-line COB structure, which is capable of avoiding pattern defect upon photolithography.

This invention also provides a semiconductor memory device having open-bit-line memory cells as small as $6.1F^2$ at minimum, which is approximate to a theoretical value of $6F^2$.

Now, description will be made as regards a few embodiments of this invention with reference to the drawing.

Figure 8:
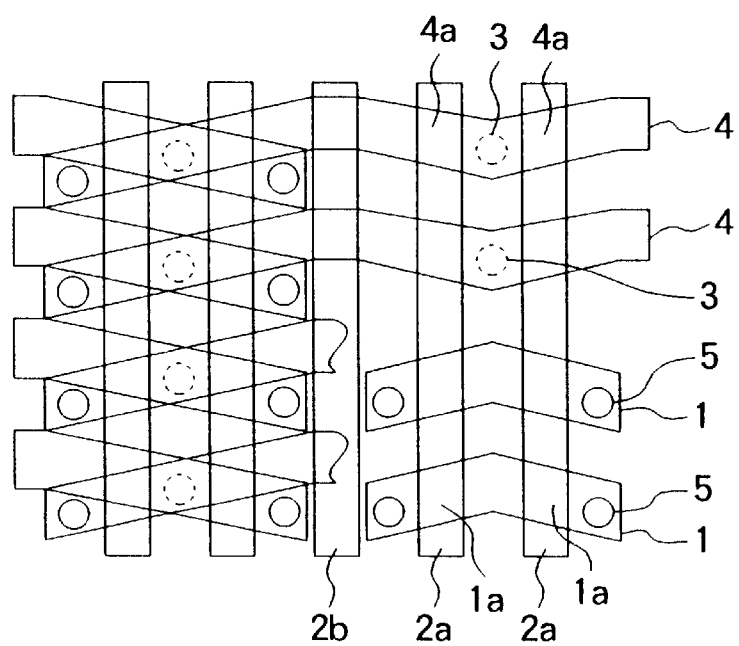
FIG. 8 is a plan view of a memory cell arrangement of a semiconductor memory device according to a first embodiment of this invention.
Figure 9:
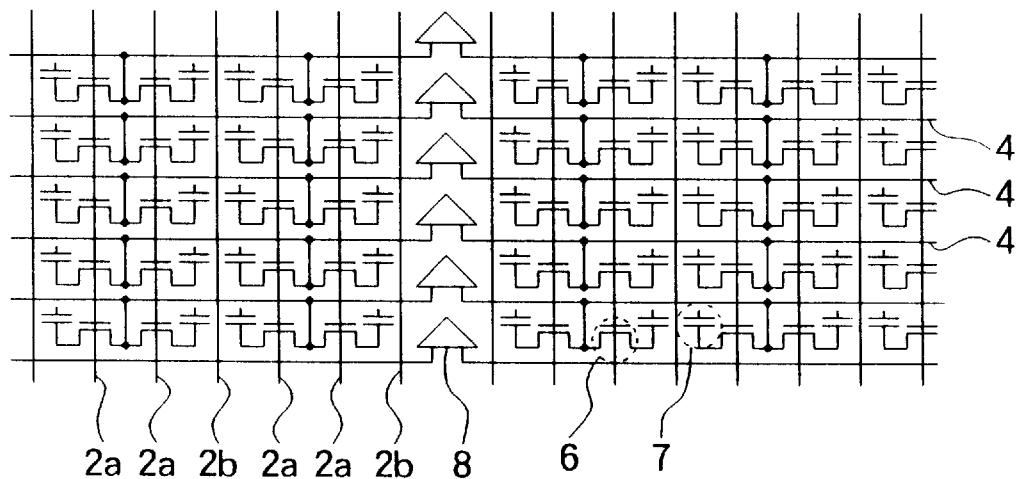
FIG. 9 is a circuit diagram of an equivalent circuit of an open-bit-line type in the first embodiment of this invention.

FIG. 6 is a plan view of a memory cell arrangement of a semiconductor memory device according to a first embodiment of this invention. For convenience of illustration, device active regions 1 are omitted in a right upper portion in FIG. 8 while bit lines 4 are excluded in a right lower portion. In order to help distinguishment between layers, word lines 2a and dummy word lines 2b in FIG. 1 are written with a line width slightly small and with a line interval slightly great although the line width and the line interval are both equal to a minimum size F. The memory cell arrangement according to this embodiment includes a portion where the device active regions 1 and the bit lines 4 intersect with the word lines 2a and the dummy word lines 2b in oblique directions reverse from each other. The oblique directions are alternately reversed at every single cell. In FIG. 8, the line width and the line interval of the device active regions 1 and the bit lines 4 are illustrated as being slightly great although they are equal to the minimum size F. Theoretically, the cell area can be made smaller than that seen from the figure. Every third one of the all word lines is the dummy word line 2b. The dummy word lines 2b are adapted, for example, to the case where an aperture portion 5 connecting a node electrode and each device active region is formed by self-matching. However, the dummy word lines 2b do not serve as word lines of a cell transistor and can therefore be omitted for the purpose of transistor operation. An equivalent circuit for the above-mentioned open-bit-line memory cell is illustrated in FIG. 9. It is understood from the figure that the dummy word lines 2b are irrelevant to reading operation of memory cell data.

Figure 10:
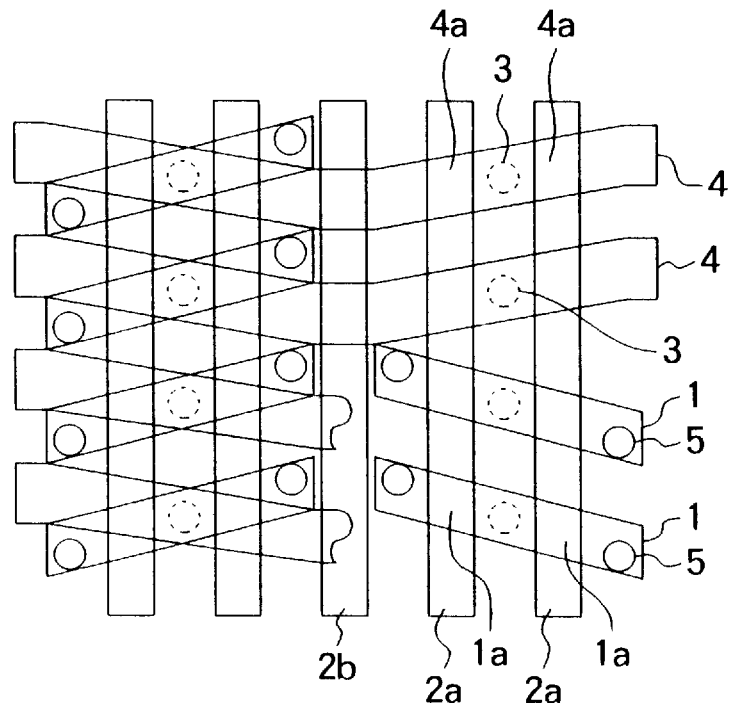
FIG. 10 is a plan view of a memory cell arrangement of a semiconductor memory device according to a second embodiment of this invention.
Figure 11:
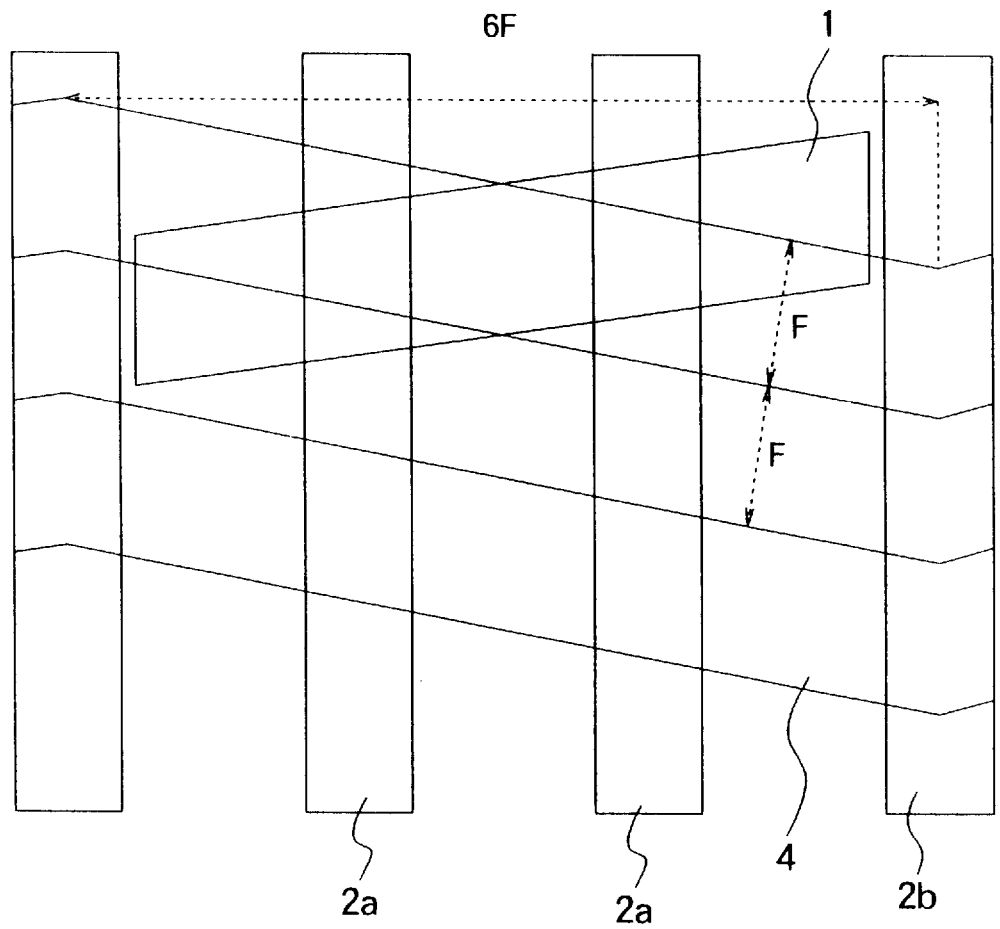
FIG. 11 is a plan view for describing an arrangement where a memory cell size is minimized in this invention.

FIG. 10 is a plan view of a memory cell arrangement of a semiconductor memory device according to a second embodiment of this invention. Like in FIG. 8, the device active regions 1 and the bit lines 4 extend in oblique directions reverse from each other. The oblique directions are alternately reversed at every two cells. Consideration will be made as regards the angle of such oblique lines in FIGS. 8 and 10. The cell area is minimized when the device active regions 1 and the bit lines 4 are reversely oblique at the same angle. Particularly, an extreme minimum is obtained with an arrangement illustrated in FIG. 11. Specifically, the bit lines 4 are reversely oblique at every 6F where F represents the minimum size. In this event, the minimum cell area is equal to about $6.085F^2$ where the line widths and the line intervals of the device active regions 1, all of the word lines 2a and 2b, and the bit lines 4 satisfy the minimum size F.

Figure 12:
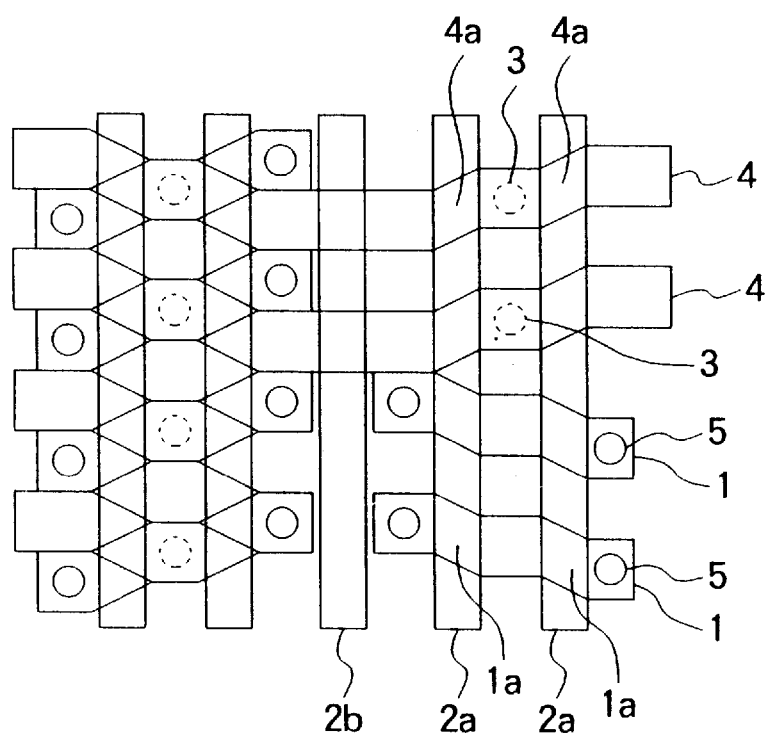
FIG. 12 is a plan view of a memory cell arrangement of a semiconductor memory device according to a third embodiment of this invention.

FIG. 12 is a plan view of a memory cell arrangement of a semiconductor memory device according to a third embodiment of this invention. In this case, the device active regions 1 and the bit lines 4 are oblique to all of the word lines 2a and 2b in restricted portions in the vicinity of the word lines. The remaining portions are formed by straight lines perpendicular to the word lines. In the above-mentioned arrangement, the most part of the area to be provided with the aperture portions 3 and 5 correspond to such straight line portions where all of the word lines 2a and 2b and the bit lines 4 perpendicularly intersect with each other. Accordingly, the above-mentioned memory cell arrangement is adapted to the case where the apertures are formed by self-matching.

Summarizing FIGS. 8 and 9, the semiconductor memory device according to the first embodiment of this invention comprises device active regions 1 (FIG. 8) and a memory cell array illustrated in FIG. 9. The device active regions 1 are separately formed on a semiconductor substrate 9 (FIG. 1A).

In FIG. 9, the memory cell array comprises a matrix of memory cell pairs. Each pair of the memory cell pairs is formed on each of the device active regions 1 and comprises a pair of memory cells. Each of the memory cells comprises a charge-storage capacitor 7 and a selection MOS transistor 6 which has a gate region and first and second regions. The first region is a predetermined one of source and drain regions 101 and 102 (FIG. 1A). The second region is a remaining one of the source and the drain regions 101 and 102 that is connected to the charge-storage capacitor 7. Word lines 2a are connected to the gate regions of the selection MOS transistors 6 of the memory cells. Bit lines 4 are connected to the first regions of the selection MOS transistors 6 of the memory cells.

In FIG. 8, the word lines 2a are arranged in parallel to each other on the semiconductor substrate 9. Each of the device active regions 1 has first oblique intersection portions 1a which obliquely intersect adjacent two of the word lines 2a in first oblique directions with a distance left between each of the device active regions 1 and each of the adjacent two of the word lines 2.

Each of the bit lines 4 has second oblique intersection portions 4a which obliquely intersect the adjacent two of the word lines 2a in second oblique directions reverse with respect to the first oblique directions with another distance left between each of the bit lines 4 and each of the adjacent two of the word lines 2a.

The first oblique directions of the first oblique intersection portions 1a of each of the device active regions 1 are reversed at every memory cell. The second oblique directions of the second oblique intersection portions 4a of each of the bit lines 4 are reversed at every memory cell.

One of the first oblique intersection portions 1a of each of the device active regions 1 obliquely intersects one of the adjacent two of the word lines 2a at a predetermined angle with respect to the above-mentioned one of the adjacent two of the word lines 2a in a counterclockwise direction, A remaining one of the first oblique intersection portions 1a of each of the device active regions 1 obliquely intersects a remaining one of the adjacent two of the word lines 2a at the predetermined angle with respect to the remaining one of the adjacent two of the word lines 2a in a clockwise direction.

One of the second oblique intersection portions 4a of each of the bit lines 4 obliquely intersects the above-mentioned one of the adjacent two of the word lines 2a at the predetermined angle with respect to the above-mentioned one of the adjacent two of the word lines 2a in the clockwise direction. A remaining one of the second oblique intersection portions 4a of each of the bit lines 4 obliquely intersects the remaining one of the adjacent two of the word lines 2a at the predetermined angle with respect to the remaining one of the adjacent two of the word lines 2a in the counterclockwise direction.

Summarizing FIGS. 10 and 12, each of the semiconductor memory devices according to the second and the third embodiments of this invention is similar to the semiconductor memory device according to the first embodiment of this invention except that the first oblique directions of the first oblique intersection portions 1a of adjacent two of the device active regions 1 adjacent to each other in a transverse direction of the word line 2a are reversed at every memory cell pair (namely, two memory cells) and that the second oblique directions of the second oblique intersection portions 4a of each of the bit lines 4 are reversed at every memory cell pair.

One of the first oblique intersection portions 1a of each of the device active regions 1 obliquely intersects one of the adjacent two of the word lines 2a at a predetermined angle with respect to the above-mentioned one of the adjacent two of the word lines 2a in a counterclockwise direction. A remaining one of the first oblique intersection portions 1a of each of the device active regions 1 obliquely intersects a remaining one of the adjacent two of the word lines 2a at the predetermined angle with respect to the remaining one of the adjacent two of the word lines 2a in the counter-clockwise direction.

One of the second oblique intersection portions 4a of each of the bit lines 4 obliquely intersects the above-mentioned one of the adjacent two of the word lines 2a at the predetermined angle with respect to the above-mentioned one of the adjacent two of the word lines 2a in the clockwise direction. A remaining one of the second oblique intersection portions 4a of each of the bit lines 4 obliquely intersects the remaining one of the adjacent two of the word lines 2a at the predetermined angle with respect to the remaining one of the adjacent two of the word lines 2a in the clockwise direction.

In the manner illustrated in FIGS. 1A through 1H by reference numerals 16 and 17, the charge-storage capacitor 7 of each of the memory cells may be formed farther from the semiconductor substrate 9 than the word and the bit lines 2a and 4.

As a first merit of this invention, it is possible to realize the small memory cell area on the order of about $6.1F^2$ at minimum, which is approximate to the theoretical value of $6F^2$. The reason is as follows. According to this invention, the memory cell arrangement includes the portion where the device active regions and the bit lines are reversely oblique to the word lines. Therefore, as compared with the case where the diffusion layer alone is oblique, the angles of these oblique lines can be nearly equal to the right angle with respect to the word lines.

As a second merit of this invention, it is possible in case of the light beam exposure to prevent the pattern defect from occurring upon the photolithography at the portions where the memory cells are discontinuous and where the surrounding cells are small in number. In case of the electron beam exposure, misalignment or dimensional error is avoided at the boundary between the simultaneous block exposure portion and the variable shape exposure portion. The reason is as follows. According to this invention, the bit lines are formed by a series of the oblique portions which are alternately reversely oblique to the word lines. Therefore, it is possible to arrange a whole of the memory cell region in a continuous fashion and in a rectangular shape.

What is claimed is:

1. A semiconductor memory device comprising:

a semiconductor substrate;

device active regions separately formed on semiconductor substrate;

a memory cell array comprising a matrix of memory cell pairs, each pair of said memory cell pair being formed on each of said device active regions and comprising a pair of memory cells, each of which comprises a charge-storage capacitor and a selection MOS transistor having a gate region and first and second regions, said first region being a predetermined one of a source region and a drain region, said second region being a remaining one of said source and said drain regions that is connected to said charge-storage capacitor;

word lines connected to said gate regions of the selection MOS transistors of said memory cells and arranged in parallel to each other on said semiconductor substrate; and bit lines connected to said first regions of the selection MOS transistors of said memory cells;

each of said device active regions having first oblique intersection portions which obliquely intersect adjacent two of said word lines in first oblique directions with a distance left between each of said device active regions and each of said adjacent two of the word lines;

each of said bit lines having second oblique intersection portions which obliquely intersect said adjacent two of the word lines in second oblique directions reverse with respect to said first oblique directions with another distance left between each of said bit lines and each of said adjacent two of the word lines;

said first oblique direction of the first oblique intersection portion of each of said device active regions being reversed at every memory cell; and said second oblique directions of the second oblique intersection portions of each of said bit lines being reversed at every memory cell.

2. A semiconductor memory device as claimed in claim 1, wherein:

one of the first oblique intersection portions of each of said device active regions obliquely intersects one of said adjacent two of the word lines at a predetermined angle with respect to said one of the adjacent two of said word lines in a counterclockwise direction, a remaining one of the first oblique intersection portions of each of said device active regions obliquely intersecting a remaining one of said adjacent two of the word lines at said predetermined angle with respect to said remaining one of the adjacent two of said word lines in a clockwise direction;

one of the second oblique intersection portions of each of said bit lines obliquely intersecting said one of the adjacent two of said word lines at said predetermined angle with respect to said one of the adjacent two of said word lines in said clockwise direction, a remaining one of the second oblique intersection portions of each of said bit lines obliquely intersecting said remaining one of the adjacent two of said word lines at said predetermined angle with respect to said remaining one of the adjacent two of said word lines in said counter-clockwise direction.

3. A semiconductor memory device comprising:

a semiconductor substrate;

device active regions separately formed on said semiconductor substrate;

a memory cell array comprising a matrix of memory cell pairs, each pair of said memory cell pairs being formed on each of said device active regions and comprising a pair of memory cells, each of which comprises a charge-storage capacitor and a selection MOS transistor having a gate region and first and second regions, said first region being a predetermined one of a source region and a drain region, said second region being a remaining one of said source and said drain regions that is connected to said charge-storage capacitor;

word lines connected to said gate regions of the selection MOS transistors of said memory cells and arranged in parallel to each other on said semiconductor substrate; and bit lines connected to said first regions of the selection MOS transistors of said memory cells;

each of said device active regions having first oblique intersection portions which obliquely intersect adjacent two of said word lines in first oblique directions with a distance left between each of said device active regions and each of said adjacent two of the word lines;

each of said bit lines having second oblique intersection portions which obliquely intersect said adjacent two of the word lines in second oblique directions reverse with respect to said first oblique directions with another distance left between each of said bit lines and each of said adjacent two of the word lines;

said first oblique directions of the first oblique intersection portions of adjacent two of said device active regions adjacent in a transverse direction of said word lines being reversed at every memory cell pair; and said second oblique directions of the second oblique intersection portions of each of said bit lines being reversed at every memory cell pair.

4. A semiconductor memory device as claimed in claim 1, wherein the charge-storage capacitor of each of said memory cells is formed farther from said semiconductor substrate than said word and said bit lines.

5. A semiconductor memory device as claimed in claim 3, wherein the charge-storage capacitor of each of said memory cells is formed farther from said semiconductor substrate than said word and bit lines.

* * * * *